United States Patent
Hamburgen et al.

(10) Patent No.: US 10,180,709 B1
(45) Date of Patent: Jan. 15, 2019

(54) THERMALLY INSULATING ADHESIVE

(71) Applicant: Google Inc., Mountain View, CA (US)

(72) Inventors: William Riis Hamburgen, Palo Alto, CA (US); James Cooper, San Francisco, CA (US)

(73) Assignee: GOOGLE LLC, Mountain View, CA (US)

(*) Notice: Subject to any disclaimer, the term of this patent is extended or adjusted under 35 U.S.C. 154(b) by 11 days.

(21) Appl. No.: 15/460,049

(22) Filed: Mar. 15, 2017

(51) Int. Cl.
*G06F 1/20* (2006.01)
*H01L 23/367* (2006.01)
*H01L 23/373* (2006.01)
*H05K 7/18* (2006.01)
*H01L 23/34* (2006.01)
*H05K 7/20* (2006.01)
*G06F 1/16* (2006.01)
*H01L 23/36* (2006.01)
*H01L 23/46* (2006.01)
*H05K 7/00* (2006.01)
*H01L 23/42* (2006.01)

(52) U.S. Cl.
CPC ............. *G06F 1/20* (2013.01); *G06F 1/16* (2013.01); *H01L 23/34* (2013.01); *H01L 23/345* (2013.01); *H01L 23/36* (2013.01); *H01L 23/3675* (2013.01); *H01L 23/373* (2013.01); *H01L 23/3733* (2013.01); *H01L 23/42* (2013.01); *H01L 23/46* (2013.01); *H05K 7/00* (2013.01); *H05K 7/18* (2013.01); *H05K 7/20* (2013.01)

(58) Field of Classification Search
None
See application file for complete search history.

(56) References Cited

U.S. PATENT DOCUMENTS

| | | | |
|---|---|---|---|
| 2003/0043541 A1* | 3/2003 | Yuasa | A01N 25/10 361/679.54 |
| 2003/0170450 A1* | 9/2003 | Stewart | H05K 3/305 428/343 |
| 2013/0286609 A1* | 10/2013 | Merz | H05K 1/0216 361/760 |
| 2015/0077957 A1* | 3/2015 | Sakatani | B32B 7/12 361/757 |

FOREIGN PATENT DOCUMENTS

CN 203637258 U * 6/2014

* cited by examiner

*Primary Examiner* — Dimary Lopez Cruz
*Assistant Examiner* — Zhengfu Feng
(74) *Attorney, Agent, or Firm* — Brake Hughes Bellerman LLP

(57) ABSTRACT

A computing device includes a case enclosure, a heat-generating electrical component, and a thermal insulator. The thermal insulator has a first surface adhesively bonded to the surface of the case enclosure and has a second surface adhesively bonded to the surface of the heat-generating component. The thermal insulator includes a layer of thermally-insulating material between the first and second surfaces, and the thermally-insulating material has a thermal conductivity less than 35 mW/m-K.

18 Claims, 3 Drawing Sheets

THERMALLY INSULATING ADHESIVE

FIELD

This disclosure relates to thermally insulating materials and, in particular, to thermally insulating materials with adhesive layers for use as thermal insulators and structural components.

BACKGROUND

In laptop computers and other electronics devices, hot components near the inner case wall of the electronics device often create external hotspots that can be uncomfortable or dangerous to the user. In other words, when an electrical component is being used, the electrical component may generate heat. This electrical component may transfer heat to the enclosure of the device, which essentially creates a hotspot on the enclosure that may be uncomfortable or dangerous to the user especially in the case of a metal enclosure.

The International Electrotechnical Commission (IEC) provides a set of standards for electrical devices, which includes a maximum temperature limit for areas on the outside of the device itself. Typically, most electronic manufacturers adhere to this requirement by limiting the temperature below the maximum temperature provided by the IEC. One particular example of an IEC standard indicates that if the device has a metal or otherwise thermally-conductive surface, the surface must be held at a lower temperature than an equivalent plastic surface. For example, with heated metal surfaces, the heat can be transferred quickly to the user touching the hot metal surface. Therefore, the metal surface can feel relatively hot even at a relatively low temperature. However, metal surfaces for electrical devices are typically used because they can quickly transfer heat from the hot electrical component, thereby keeping the hot electrical component cooler. As such, in some situations, a hotspot on the metal enclosure may occur over the hot electrical component. Further, in the event that an electrical component (e.g., CPU) is processing video graphics, the metal case enclosure may become very hot in the area of the electrical component. Surfaces composed of, for example, plastic, glass, ceramic, and wood, also can develop hotspots in the same or similar ways.

To avoid a hot spot on the case enclosure, a system designer may create an air gap between the hot component and the enclosure. The size of the air gap may be relatively proportional to the usefulness of the insulation, e.g., the larger the air gap between the hot component and the enclosure, the better the thermal insulation. As such, the size of the air gap may be considered a critical item for determining the overall thickness of the device. However, in the area of consumer electronics, thinner electronic devices may be more marketable, while bulkier consumer electronics may have a perception of being of lower quality. Therefore, there may be an incentive to design an electronic device as thin as possible, which greatly affects the air gap, thereby affecting the heat transferred to the user.

In many consumer electronics devices, the heat-generating components are located on a main logic board (MLB), and the MLB is attached to the case enclosure with adhesive material. Because the MLB touches the housing through the adhesive, the adhesive conducts heat away from the MLB to the housing. Even when the MLB is separated from the case enclosure by small area standoffs or pillars (e.g., located at the corners of the MLB) to create an air gap between the MLB and the case enclosure, heat still is conducted through the standoffs and the adhesive that connects the standoffs to the case enclosure. When the thermal conductivity of the standoffs and the adhesive is greater than the thermal conductivity of air, as is generally the case, the standoffs and the adhesive create a thermal short-circuit between the MLB and the case enclosure, such that the usefulness of the air gap between the MLB and the case enclosure is limited.

SUMMARY

In one general aspect, an apparatus includes a first layer of thermally-insulating material having a thermal conductivity less than 35 mW/m-K, a second adhesive layer on a top surface of the thermally-insulating material, and a third adhesive layer on a bottom surface of the thermally-insulating material, wherein the bottom surface is substantially parallel to the top surface.

Implementations can include one or more of the following features, alone or in any combination with each other. For example, the thermal conductivity of the thermally-insulating material can be less than 25 mW/m-K. A thickness of the apparatus in a direction perpendicular to the first, second, and third layers can be less than 4 mm. A thickness of the second adhesive layer can be less than 10% of a thickness of the first layer and a thickness of the third adhesive layer can be less than 10% of the thickness of the first layer. A density of the thermally-insulating material can be less than 0.2 g/cc.

The thermally-insulating material can include a silica-based aerogel. The thermally-insulating material can include fumed silica. A minimum compressive pressure in a direction perpendicular to the top surface that causes the thermally-insulating material layer to fail can exceed 100 kPa. A minimum tensile pressure that causes the thermally-insulating material layer to fail can exceed 20 kPa. The first and second adhesive layers can be configured to adhere the apparatus to a metal surface with an adhesive bond that is not broken when a tensile pressure of up to 100 kPa is applied to the apparatus.

In another general aspect, a computing device includes a case enclosure, a heat-generating electrical component, and a thermal insulator. The thermal insulator has a first surface adhesively bonded to the surface of the case enclosure and has a second surface adhesively bonded to the surface of the heat-generating component. The thermal insulator includes a layer of thermally-insulating material between the first and second surfaces, and the thermally-insulating material has a thermal conductivity less than 35 mW/m-K.

Implementations can include one or more of the following features, alone or in any combination with each other. For example, the heat-generating component can include a main logic board of the computing device. The heat-generating component can include a central processing unit of the computing device. The thermal conductivity of the thermally-insulating material layer can be less than 25 mW/m-K. A thickness of the thermally-insulating material layer can be less than 4 mm. The thermally-insulating material layer can include a silica-based aerogel. The thermally-insulating material layer can include fumed silica. A minimum compressive pressure in a direction perpendicular to the first surface that causes the thermally-insulating material layer to fail can exceed 100 kPa. A minimum tensile pressure between the heat-generating component and the case enclosure that causes the thermally-insulating material layer to fail can exceed 20 kPa. A tensile pressure of greater than 100 kPa can be required to break the adhesive bond between the thermal insulator and the case enclosure or to break the adhesive bond between the thermal insulator and the heat-generating component.

The details of one or more implementations are set forth in the accompanying drawings and the description below. Other features will be apparent from the description and drawings, and from the claims.

DETAILED DESCRIPTION

As described herein, a solid material having very low thermal conductivity (i.e., close to, or lower than, the thermal conductivity of air) (e.g., less than 35 mW/m-K, less than 30 mW/m-K or less than 25 mW/m-K) can have an adhesive layer on opposite surfaces (e.g., a top and bottom surface) of the material. Then, the very low thermal conductivity material can be adhered to a heat-generating device on a first surface and can be adhered, on a second surface, to a second component that has a temperature lower than that of the heat-generating device. For example, in one implementation, the very low thermal conductivity material can be adhered to the case enclosure of a computing device on the first surface of the material, and a second surface of the very low thermal conductivity can be adhered to a MLB of the computing device. Thus, the MLB and the heat-generating components on the MLB can be separated from the case enclosure by material that has a very low thermal conductivity and therefore does not provide a thermal short-circuit between the MLB and the case enclosure, and the MLB can be easily attached to the case enclosure through the use of adhesive coatings on the opposing surfaces of the solid material. It has been surprisingly discovered that certain materials and structures having very low thermal conductivity (i.e., close to, or lower than, the thermal conductivity of air) also can have sufficiently strong structural properties to allow them to be used to secure one component to another component. The use of the very low thermal conductivity material to thermally insulate a MLB from a case enclosure of a computing device is but one example implementation of the very low thermal conductivity material and other uses are also contemplated, both with a computing device and elsewhere.

Figure 1:
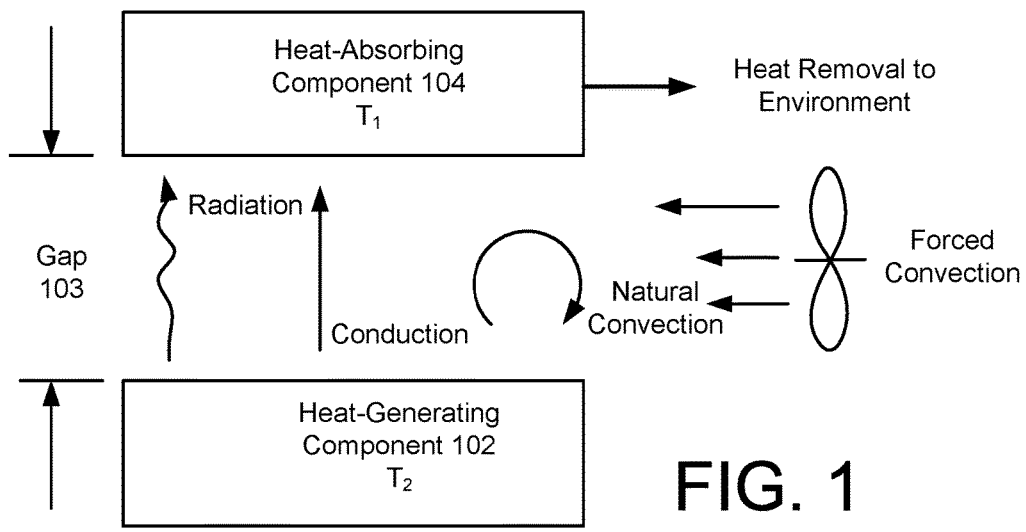
FIG. 1 illustrates different modes of heat transfer across a gap according to an embodiment.

FIG. 1 illustrates different modes of heat transfer across a gap according to an embodiment. Generally, heat transfer may be accomplished through radiation, conduction, natural convection, and/or forced convection. For example, a heat-generating component 102 having a relatively high temperature ($T_1$) may transfer heat via a gap 103 to a heat-absorbing component 104 (also known as a heat-dissipating component) having a relatively lower temperature ($T_2$) via radiation, conduction, natural convection, and/or forced convection. The heat-generating component 102 may be any type of component capable of generating heat due to the operation of the component itself. In the context of electrical devices, the heat-generating component 102 may include a central processing unit (CPU) or generally any type of component that generates heat when employed within the electrical device. The heat-absorbing component 104 may be any type of component capable of absorbing heat. In the context of electrical devices, the heat-absorbing component 104 may be a case or enclosure capable of housing the heat-generating component 102. For example, the heat-absorbing component 104 may be a metal or non-metal case or wall of a case that houses several electrical components.

Also, the heat-generating component 102 may have a temperature ($T_1$) that is higher than the temperature ($T_2$) of the heat-absorbing component 104. Naturally, the heat generated by the heat-generating component 102 may be transferred to the lower temperature component, e.g., the heat-absorbing component 104, via radiation, conduction, natural convection, and/or forced convection, as further explained below.

Generally, heat transfer by radiation is driven by the difference between the absolute temperature of a heat-emitting body (e.g., the heat-generating component 102) and one or more cooler surrounding regions (e.g., the heat-absorbing component 104), which may absorb heat from electromagnetic radiation that is derived from black body emissions, where the emissions may be a function of the absolute temperature of the heat-generating component 102. With emissivity=1 (e.g., perfect black body radiation), conduction through air dominates in the gap 103 when the gap 103 is smaller than approximately 3.7 mm, and as emissivity decreases, this crossover point increases proportionately.

Heat transfer by conduction is the transfer of heat through the material itself such as a liquid, gas, or a solid at a rate proportional to the thermal conductivity of the material, which may be relatively high for materials such as a diamond, copper, and aluminum, and relatively low for air, glass, and plastic materials. Stated another way, heat transfer by conduction is the transfer of heat through the material of the gap, which may be air or any type of gas, liquid, or solid.

Heat transfer by convection is the transfer of heat from one place to another by the movement of fluids (e.g., gases, liquids). In particular, forced convection is a mechanism, or type of transport in which fluid motion is generated by an external source such as a fan. In contrast, heat transfer by natural convection (also referred to as free convection), occurs due to temperature differences between the heat-generating component 102, and the heat-absorbing component 104 which affect the density, and thus relative buoyancy, of the fluid. Convection cells are formed due to density differences within a body, where there is a circulated pattern of fluid cooling the body. In particular, the fluid surrounding the heat source receives heat, becomes less dense and rises, and then the surrounding, cooler fluid then moves to replace it. For instance, the density of a fluid decreases with increasing temperature because of volumetric expansion, which may induce natural convection flow. However, this depends on the configuration of the components, as explained below.

For example, with respect to natural convection between parallel horizontal plates in air (e.g., where the hotter plate is on top), this configuration is inherently stable because the lighter fluid is already above the cooler heavier fluid. There is no tendency for this system to move away from the state of equilibrium, and any heat transfer between the plates will be accomplished via conduction and, when closely spaced, radiation. With respect to natural convection between parallel vertical plates in air, the gap 103 has to be greater than or approximately equal to 7 mm for natural convection to begin to play a substantial role in the transfer of heat across the air gap 103. For example, convection cells generally cannot form when the gap 103 is less than 7 mm. As such, conduction and radiation will dominate over natural convection (i.e., free convection) from component to case when the size of the gap 103 is less than 7 mm, and conduction will dominate over natural convection and radiation from component to case when the size of the gap 103 is less than 3.7 mm.

For 1 mm gaps (which are common in laptop computers or other electrical devices), conduction dominates heat transfer over radiation and convection. As such, as discussed herein, the size of the gap 103 when conduction dominates over radiation and convection may be approximately less than 3.7 mm, and may be occasionally referred to as a small gap. Also, the inventors have recognized that the size of the gap 103 affects the amount of conduction heat flow across the gap 103, as discussed with respect to FIG. 2.

Figure 2:
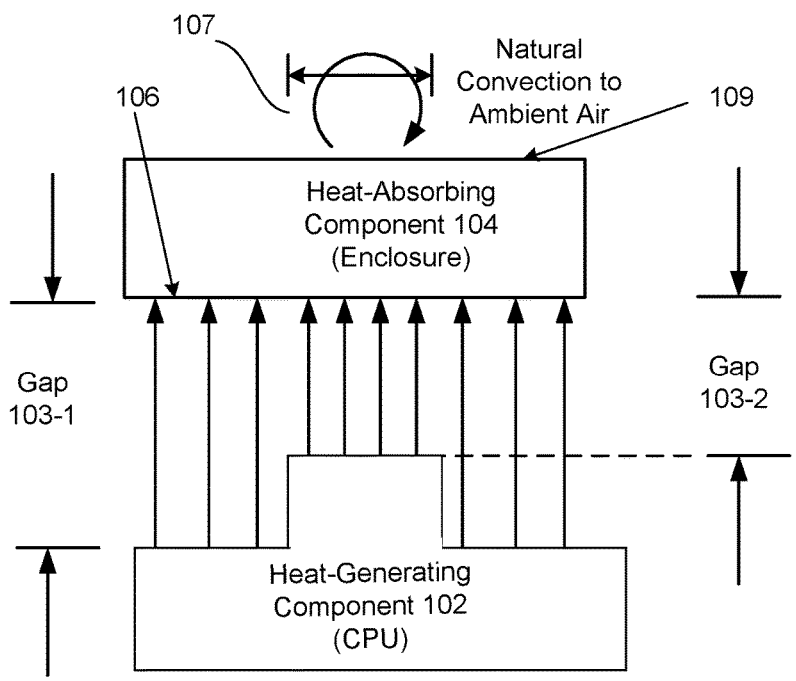
FIG. 2 illustrates heat transfer by conduction across the gap according to an embodiment.

FIG. 2 illustrates heat transfer by conduction across the gap 103 according to an embodiment. In this example, the heat-generating component 102 may include a CPU, and the heat-absorbing component 104 may include an enclosure that houses the CPU. A first gap 103-1 may exist between a component (or portion) of the heat-generating component 102 and an inner surface 106 of the enclosure, and a second gap 103-2 smaller than the first gap 103-1 may exist between the CPU portion and the inner surface 106 of the heat-absorbing component 104. A relatively larger conduction heat flow may exist across the second gap 103-2, and a relatively smaller conduction heat flow may exist across the first gap 103-1. As such, the heat transferred across the second gap 103-2 may result in a hotspot 107, which is a relatively hot/warm region on an outer surface 109 of the enclosure where a user may make contact. The heat transferred to the enclosure (e.g., the heat-absorbing component 104) may be subsequently transferred to the surrounding ambient air via natural convection.

Figure 3:
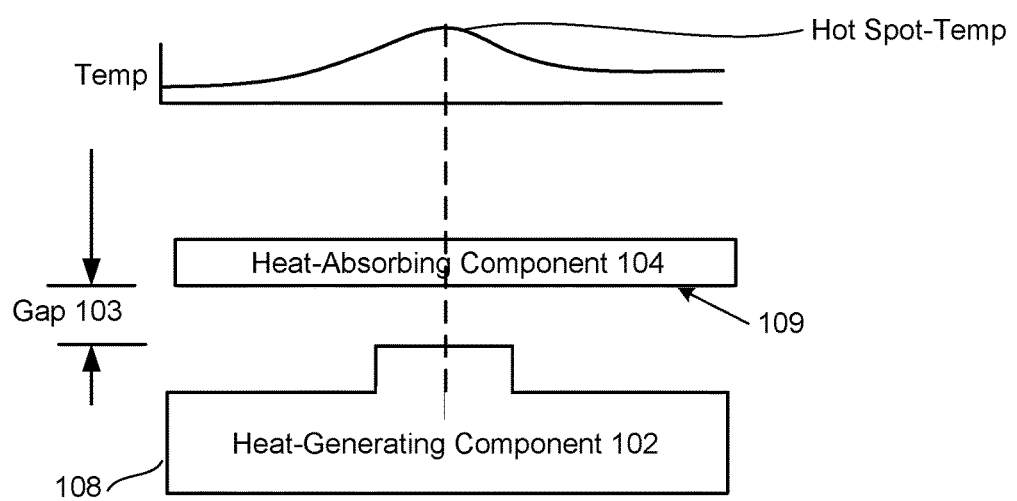
FIG. 3 illustrates a temperature distribution on a surface of an enclosure without an insulator provided in the gap according to an embodiment.

FIG. 3 illustrates a temperature distribution 108 on the outer surface 109 of the heat-absorbing component 104 without an insulator provided in the gap 103 according to an embodiment. For instance, the temperature distribution 108 shows the difference in temperature across the outer surface 109 of the heat-absorbing component 104, which increases towards the area of the hotspot 107 in FIG. 2 where the gap 103 is smaller.

An insulator may be provided in the gap 103 to reduce the amount of heat transfer when a higher amount of heat exists than what is desired. However, as demonstrated above, the size of the gap 103 affects the type of heat transfer (e.g., conduction, convection, or radiation), which affects the type of insulation used to counter the heat transfer. In one example, a hard vacuum surrounded by a metal surface may be provided as an insulator, which is effective for eliminating convection and conduction. However, the problem of insulating with a vacuum is that for any kind of flat application atmospheric pressure tends to collapse the container walls. This may be countered by posts or pillars within the container, however, the posts or pillars typically end up becoming a major conductor of heat, reducing the performance of the vacuum insulator. Also, the container itself conducts heat across the gap.

For relatively larger gaps, adding insulation such as fiberglass is relatively effective because the fiberglass breaks up the ability of the convection cells to form, thereby preventing heat transfer by convection. As such, with larger gaps, insulation such as fiberglass or low density styrene foam, or urethane forms is useful because they reduce heat transfer by convection. Although these types of insulators are effective to prevent heat transfer by natural convection/radiation, they still allow conduction flow through the gaps that are filled with the insulation, and then through the insulation material itself. Because most solids have higher thermal conductivity as compared to gases, conventional insulators typically use a low density material such as loose fiberglass. Also, with respect to reducing heat transfer by radiation, solutions such as MLI (multi-layer insulation) have been utilized. MLI may consist of many layers of a reflective material in tiny gaps for purposes of insulating in vacuums or with large temperature differences (e.g., aerospace and some exotic automotive underhood applications).

However, the difficulty increases when the gaps are relatively small such as approximately less than 3.7 mm, and increases when the gaps are even smaller such as approximately equal to or less than 1 mm. Generally, within electrical devices such as laptop computers, personal computers, and smart phones, smaller gaps (e.g., less than 2 mm) are more common due to market pressures of creating smaller and thinner devices. In this context, for small gaps, convection cells cannot form. Therefore, preventing heat transfer by convection is relatively unimportant. Essentially, the small gap contains stagnant air, and if at least a portion of the stagnant air in the gap 103 is replaced by an insulator such as a solid, it makes matters worse because conventional solid-based insulators have higher thermal conductivity than air. Therefore, insulating small gaps with conventional foam and/or fiberglass insulation will not be effective for reducing heat transfer across the gap 103.

Figure 4:
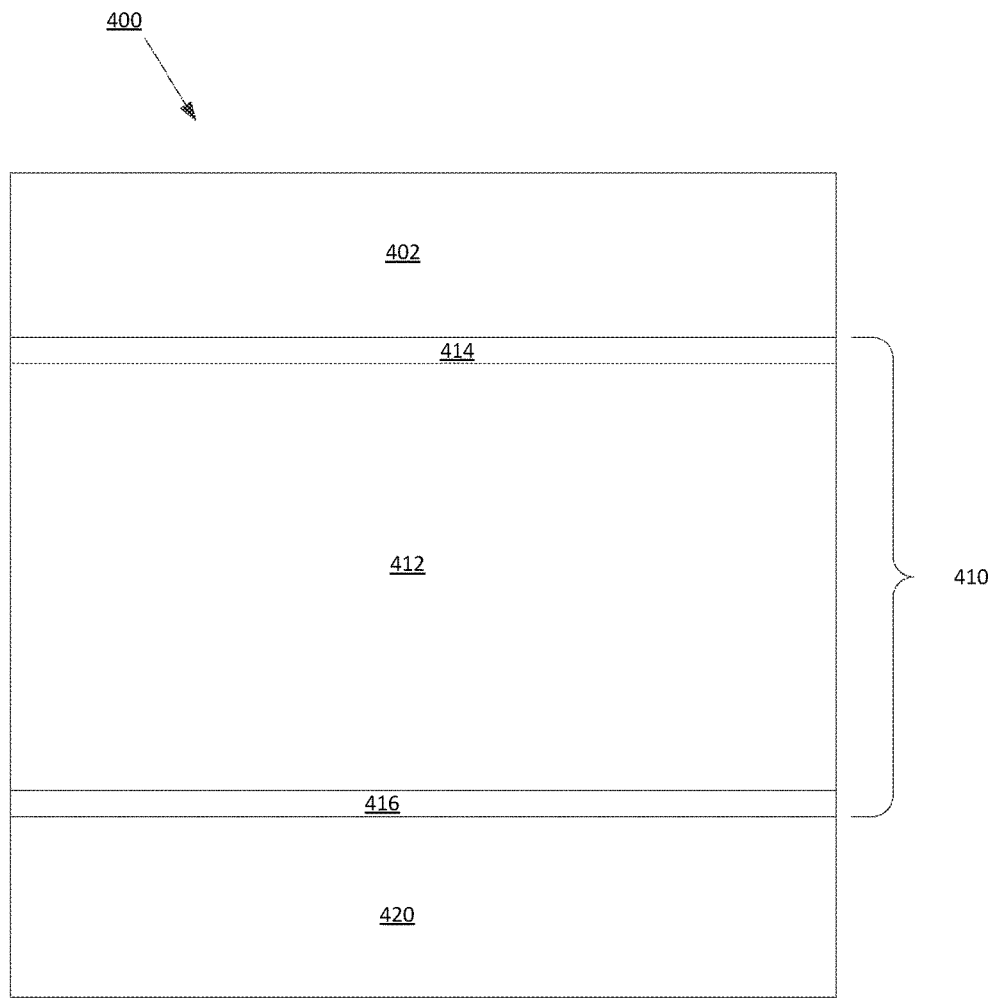
FIG. 4 is a schematic diagram of a system in which a heat-generating component is attached to a second component by an adhesive coated thermal insulator.

FIG. 4 is a schematic diagram of a system 400 in which a heat-generating component 402 is attached to a second component 420 by an adhesive coated thermal insulator 410. The heat-generating component 402 can be any component that generates heat during its operation, such that a temperature of the heat-generating component 402 is higher than an temperature of the second component. The thermal insulator 410 includes a thermal insulator layer 412 and the first adhesive layer 414 and a second adhesive layer 416. In some implementations, the heat-generating component 402 can include one or more components used in a computing device (e.g., a central processing unit, a graphics processing unit, a camera module, a battery, a speaker, a fan, a display, a connector, a magnet, an antenna, etc.). In some implementations, the heat-generating component 402 can include a plurality of subcomponents, for example, the heat-generating component 402 can be a main logic board of a computing device that includes a plurality of electrical components that are attached to the main logic board. The second component 420 can be a component that is at a different temperature than the heat-generating component 402. For example, the second component 420 can be a wall of a case enclosure of a computing device that is at a lower temperature than the heat-generating device 402.

Within the thermal insulator 410, because the thermal conductivity of the adhesive layers 414, 416 is generally greater than the thermal conductivity of the thermal insulating layer 412, the thermal insulating layer 412 can be thicker than the first adhesive layer 414 and thicker than the second adhesive layer 416, so that the insulator 410 as a whole provides good thermal insulating characteristics. In some implementations, each of the first and second adhesive players 414, 416 can be no more than one third the thickness of the thermal insulating layer 412. In some implementations, the first and second adhesive layers 414, 416 can be less than approximately 25 μm thick, and in some implementations the first and second adhesive layers 414, 416 can be less than approximately 12 μm thick. In some implementations, the thermal insulating layer 412 can be between 400 and 3 mm thick.

In some implementations, the thermal insulating layer 412 can include a silica-based aerogel that has a thermal conductivity that is close to, or less than, that of air. In some implementations, the thermal insulating layer 412 can include fumed silica that has a thermal conductivity that is close to, or less than, that of air. For example, the thermal conductivity of the thermal insulating layer 412 can be less than 35 milliwatts per meter-Kelvin (mW/m-K) at 60° C., less than 30 mW/m-K, or less than 26 mW/m-K.

Aerogels describe a class of material based upon their structure, namely low density, open cell structures, large surface areas (e.g., greater than 900 m²/g) and subnanometer scale pore sizes. Supercritical and subcritical fluid extraction technologies are commonly used to extract the fluid from the fragile cells of the material. A variety of different aerogel compositions are known and may be inorganic or organic. Inorganic aerogels are generally based upon metal alkoxides and include materials such as silica, carbides, and alumina. Organic aerogels include carbon aerogels and polymeric aerogels such as polyimides.

Low density aerogels (0.02-0.2 g/cc) based upon silica are excellent insulators, better than the best rigid foams, with thermal conductivities of 20 mW/m-K and below or of 15 mW/m-K and below or of 10 mW/m-K and below at 60° C. and atmospheric pressure. Aerogels function as thermal insulators by minimizing conduction (because of the low-density, thin-cell-walled, and complexly-structured material that provides a weak conduction path), convection (very small pore sizes minimize convection in the Knudsen diffusion regime), and radiation (IR suppressing dopants may easily be dispersed throughout the aerogel matrix). Depending on the formulation, they can function well at temperatures of 550° C. and above. However, in a monolithic state they tend to be fragile and brittle and are commonly believed to be not well suited for most applications outside of the laboratory.

Fumed silica, also known as pyrogenic silica because it is produced in a flame, is another type of material that can have a thermal conductivity less than that of air. Fumed silica includes microscopic droplets of amorphous silica fused into branched, chainlike, three-dimensional secondary particles that agglomerate into tertiary particles. The resulting powder has a low bulk density and high surface area. Fumed silica is chemically similar to silica-based aerogel, although fumed silica generally has smaller aggregate sizes, lower surface areas, and smaller pore volumes then aerogel.

Other materials, in addition to silica, also can be used to make aerogels and fumed materials. For example, carbon-based aerogels and metal oxide-based aerogels also are possible, although their thermal properties may not be as favorable as those of silica-based aerogels.

In some implementations, the thermal insulating layer 412 can include a container of gas (e.g., xenon or argon) having a thermal conductivity lower than that of air, as described, for example, in U.S. patent application Ser. No. 13/662,030, entitled "INSULATOR MODULE HAVING STRUCTURE ENCLOSING ATMOSPHERIC PRESSURE GAS," filed Oct. 26, 2012, which is incorporated herein by reference in its entirety.

The mechanical properties of the thermal insulating layer 412 can be suitable for using the thermal insulator 410 to secure one component to another component and to hold the components together when subjected to predetermined forces. For example, the tensile strength of the thermal insulating layer 412 that has a thermal conductivity less close to, or less than, that of air can be greater than or equal to 20 kPa, so that the two components that are secured to each other by the thermal insulator 410 are not pulled apart when subjected to a tensile load of less than 20 kPa.

The adhesive layers 414, 416 of the thermal insulator 410 can take on a number of different forms. In one implementation, the adhesive layers 414, 416 can be generally uniform layers of adhesive that is applied to the opposing surfaces of the thermal insulating layer 412. For example, liquid layers of adhesive may be applied to the opposing surfaces of the thermal insulating layer 412 and then cured to a stable form. In another implementation, the thermal insulating layers 414, 416 can include double-sided adhesive layers applied to a thin substrate (e.g., a tape), and then the substrate with the double-sided adhesive layers can be applied to the opposing surfaces of the thermal insulating layer 412.

In some implementations, the thermal insulator 410 that connects the heat-generating component 402 to the second component 420 can be a single component. For example, the thermal insulator 410 can be a single piece of material that is adhered to the case enclosure of a computing device on one surface of the thermal insulator and that is adhered to the MLB of the computing device on a second surface of the thermal insulator. In some implementations, multiple thermal insulators 410 can be used to secure a heat-generating device 402 to a case enclosure 420. For example, a plurality of thermal insulators 410, positioned around the perimeter of a main logic board could be used as standoffs to secure the main logic board to a housing of a computing device. In this manner, an air gap between the heat-generating main logic board and the housing may exist, such that a smaller amount of material used in the thermal insulator 410, which may be relatively expensive, may be necessary.

FIG. 4 is not drawn to any particular scale, and the thickness (in the direction perpendicular to the layers shown in the figure) of the adhesive coated thermal insulator 410 can be many times less than the width of the adhesive coated thermal insulator 410 (in the plane of the layers shown in the figure). For example, in some implementations, the thickness of the adhesive coated thermal insulator 410 can be less than 4 mm, and the minimum width of the adhesive coated thermal insulator 410 can be a least one centimeter.

In some implementations, the adhesive coated thermal insulator 410 can be used as a thermal insulating pad between a heat-generating component of a computing device and an outer case wall of the computing device and can be used to structurally secure the component to the case wall. For example, the adhesive coveted thermal insulator 410 can be sized to approximately match the area of the heat-generated component (e.g., a main logic board), such that the surface areas of the adhesive layers 414, 416 on the opposing surfaces of the thermal insulating layer 412, and the surface area of the thermal insulator itself, are approximately equal to the surface area of the heat-generated component. Then, the adhesive coated thermal insulator 410 can be secured to the inside surface of a case housing 420 of the computing device, by pressing the adhesive layer 416 against the case housing. The pressure used to secure the adhesive coated thermal insulator 410 to the case housing 420 should be less than the maximum compressive pressure that the thermal insulating layer 412 can withstand. For example, in some implementations, the pressure used to secure the adhesive coated thermal insulator 410 to the case housing 420 can be less than 100 kPa. Likewise, the heat-generating component 402 can be secured to the adhesive coated thermal insulator 410 by pressing a surface of the heat-generating component 402 against the adhesive layer 414 of the insulator 410. Again, the pressure used to secure the heat-generating component 402 to the insulator 410 should be less than the maximum pressure that the thermal inflating layer 412 can withstand. In some implementations, the pressure used to secure the heat-generating component 402 to the insulator 410 can be less than 100 kPa.

The adhesive layers 414, 416 of the adhesive coated thermal insulator 410 can secure the heat-generating component 402 to the case enclosure 420, Within adhesion strength sufficient to withstand a tensile pressure that is greater than the maximum tensile pressure that the insulating layer 412 can withstand, such that the bond between the heat-generating component 402 and the case closure 420 will fail at the insulating layer 412 before it fails at one of the adhesive layers 414, 416. In some implementations, the maximum tensile pressure that the insulating layer 412 can withstand can be greater than 20 kPa.

In some implementations, rather than the adhesive coated thermal insulator 410 take the shape of a pad having an area that approximately matches the area of the heat-generating component 402, the adhesive coated thermal insulator that is used to secure the component 402 to the case 420 can have a smaller area than the area of the component 402. For example, the insulator 410 can be in the form of at least three pieces that are placed, for example, at the perimeter of the heat-generating component 402 and that are used to secure the component 402 to the case 420.

The insulator 410 can be used to provide thermal insulation between components other than a main logic board and the case enclosure of a computing device. For example, the insulator 410 can be used to secure a camera module to a case enclosure of a computing device (e.g., a smartphone) and to provided thermal insulation between the camera module and the case enclosure. Portions of the camera module (e.g. the solid state sensor of the module) can become hot during operation, and the insulator 410 can provide good thermal insulation between the module and the case enclosure. In another example, a GPS module can be secured to the case enclosure with the insulator 410. In another example, a battery can be secured to the case enclosure with the insulator 410.

The insulator 410 also can be used in other contexts, other than in a computing device. For example, sheets of the insulator 410 can be used as thermal insulation in walls of buildings or in cabins and/or engine compartments of vehicles, can be used in containers of materials used in industrial processes, etc.

It will be appreciated that the above embodiments that have been described in particular detail are merely example or possible embodiments, and that there are many other combinations, additions, or alternatives that may be included.

What is claimed is:

1. An apparatus comprising:
a first layer of thermally-insulating material having a thermal conductivity less than 35 mW/m-K;
a second adhesive layer on a top surface of the thermally-insulating material, wherein a minimum compressive pressure in a direction perpendicular to the top surface that causes the thermally-insulating material layer to fail exceeds 100 kPa; and
a third adhesive layer on a bottom surface of the thermally-insulating material, wherein the bottom surface is substantially parallel to the top surface.

2. The apparatus of claim 1, wherein the thermal conductivity of the thermally-insulating material is less than 25 mW/m-K.

3. The apparatus of claim 1, wherein a thickness of the apparatus in a direction perpendicular to the first, second, and third layers is less than 4 mm.

4. The apparatus of claim 1, wherein a thickness of the second adhesive layer is less than 10% of a thickness of the first layer, and a thickness of the third adhesive layer is less than 10% of the thickness of the first layer.

5. The apparatus of claim 1, wherein a density of the thermally-insulating material is less than 0.2 g/cc.

6. The apparatus of claim 1, wherein the thermally-insulating material includes a silica-based aerogel.

7. The apparatus of claim 1, wherein the thermally-insulating material includes fumed silica.

8. The apparatus of claim 1, wherein a minimum tensile pressure that causes the thermally-insulating material layer to fail exceeds 20 kPa.

9. The apparatus of claim 1, wherein the first and second adhesive layers are configured to adhere the apparatus to a metal surface with an adhesive bond that is not broken when a tensile pressure of up to 100 kPa is applied to the apparatus.

10. A computing device comprising:
a case enclosure;
a heat-generating electrical component; and
a thermal insulator having a first surface adhesively bonded to the surface of the case enclosure and having a second surface adhesively bonded to the surface of the heat-generating component, wherein the thermal insulator includes a layer of thermally-insulating material between the first and second surfaces, the thermally-insulating material having a thermal conductivity less than 35 mW/m-K, wherein a minimum compressive pressure in a direction perpendicular to the first surface that causes the thermally-insulating material layer to fail exceeds 100 kPa.

11. The computing device of claim 10, wherein the heat-generating component includes a main logic board of the computing device.

12. The computing device of claim 10, wherein the heat-generating component includes a central processing unit of the computing device.

13. The computing device of claim 10, wherein the thermal conductivity of the thermally-insulating material layer is less than 25 mW/m-K.

14. The computing device of claim 10, wherein a thickness of the thermally-insulating material layer is less than 4 mm.

15. The computing device of claim 10, wherein the thermally-insulating material layer includes a silica-based aerogel.

16. The computing device of claim 10, wherein the thermally-insulating material layer includes fumed silica.

17. The computing device of claim 10, wherein a minimum tensile pressure between the heat-generating component and the case enclosure that causes the thermally-insulating material layer to fail exceeds 20 kPa.

18. The computing device of claim 10, wherein a tensile pressure of greater than 100 kPa is required to break the adhesive bond between the thermal insulator and the case enclosure or to break the adhesive bond between the thermal insulator and the heat-generating component.

* * * * *